(12) United States Patent
Lim

(10) Patent No.: US 10,827,661 B2
(45) Date of Patent: Nov. 3, 2020

(54) INSPECTION APPARATUS AND METHOD, AND SYSTEM AND METHOD FOR MOUNTING COMPONENTS INCLUDING THE SAME

(71) Applicant: KOH YOUNG TECHNOLOGY INC., Seoul (KR)

(72) Inventor: Woo Young Lim, Goyang-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 682 days.

(21) Appl. No.: 15/503,259

(22) PCT Filed: Aug. 10, 2015

(86) PCT No.: PCT/KR2015/008359
§ 371 (c)(1),
(2) Date: Feb. 10, 2017

(87) PCT Pub. No.: WO2016/024778
PCT Pub. Date: Feb. 18, 2016

(65) Prior Publication Data
US 2017/0273228 A1 Sep. 21, 2017

(30) Foreign Application Priority Data
Aug. 11, 2014 (KR) .................. KR10-2014-0103115

(51) Int. Cl.
*H05K 13/08* (2006.01)
*H05K 3/30* (2006.01)
(Continued)

(52) U.S. Cl.
CPC ............. *H05K 13/08* (2013.01); *H05K 3/303* (2013.01); *H05K 3/3485* (2020.08);
(Continued)

(58) Field of Classification Search
CPC ............... H05K 13/08; H05K 13/0815; H05K 13/0817; H05K 1/0269; H05K 1/0393;
(Continued)

(56) References Cited

U.S. PATENT DOCUMENTS

2008/0289175 A1 11/2008 Inoue et al.
2008/0289518 A1* 11/2008 Inoue .................... B41F 15/26
101/123
(Continued)

FOREIGN PATENT DOCUMENTS

CN 101419264 4/2009
CN 102742380 10/2012
(Continued)

OTHER PUBLICATIONS

Chinese Office Action with English translation for Chinese Application No. 201580042581; dated Nov. 2, 2018.
(Continued)

*Primary Examiner* — Peter Dungba Vo
*Assistant Examiner* — Azm A Parvez
(74) *Attorney, Agent, or Firm* — Kile Park Reed & Houtteman PLLC

(57) ABSTRACT

The present invention relates to an inspection apparatus and method, and a system and a method for mounting components including the same. In the system for mounting components according to the present invention, solder paste inspection equipment receives mounting tolerance information from component mounting equipment, generates warp information of a flexible array board by measuring the flexible array board, generates mount-impossible information on a region where mounting of components is impossible by comparing the mounting tolerance information and the warp information, and transmits the mount-impossible information to the component mounting equipment. The (Continued)

component mounting equipment mounts components on remaining regions except for the region where mounting of components is impossible based on the mount-impossible information.

2 Claims, 2 Drawing Sheets

(51) Int. Cl.
*H05K 3/34* (2006.01)
*H05K 1/02* (2006.01)
*H05K 1/03* (2006.01)
*H05K 3/00* (2006.01)

(52) U.S. Cl.
CPC ..... *H05K 13/0815* (2018.08); *H05K 13/0817* (2018.08); *H05K 1/0269* (2013.01); *H05K 1/0393* (2013.01); *H05K 3/0097* (2013.01); *H05K 2203/0165* (2013.01); *H05K 2203/163* (2013.01); *H05K 2203/166* (2013.01); *Y10T 29/4913* (2015.01)

(58) Field of Classification Search
CPC ........... Y10T 29/4913; Y10T 29/49124; Y10T 29/49117; Y10T 29/49002
USPC ................ 29/832, 829, 825, 592.1
See application file for complete search history.

(56) References Cited

U.S. PATENT DOCUMENTS

| | | |
|---|---|---|
| 2009/0202143 A1 | 8/2009 | Mamiya |
| 2010/0001042 A1* | 1/2010 | Nagai ................ H05K 13/0465 228/102 |
| 2013/0039563 A1 | 2/2013 | Han et al. |
| 2015/0136837 A1 | 5/2015 | Maeda et al. |
| 2015/0210064 A1 | 7/2015 | Kim et al. |

FOREIGN PATENT DOCUMENTS

| | | |
|---|---|---|
| JP | 05/102698 | 4/1993 |
| JP | 3685035 | 6/2005 |
| JP | 2007-184498 | 7/2007 |
| JP | 2008-294033 | 12/2008 |
| JP | 2010-056143 | 3/2010 |
| JP | 2012-51152 | 3/2012 |
| KR | 10-2009-0087803 | 8/2009 |
| KR | 10-2013-0121747 | 11/2013 |
| WO | 2013/186963 | 12/2013 |
| WO | WO-2013186963 A1 * | 12/2013 ............. H05K 13/08 |

OTHER PUBLICATIONS

Chinese 2nd Office Action with English translation corresponding to Chinese Application or Publication No. 201580042581.8; dated Jun. 28, 2019.

International Search Report for International Application No. PCT/KR2015/008359 with English translations, dated Nov. 19, 2015.

* cited by examiner

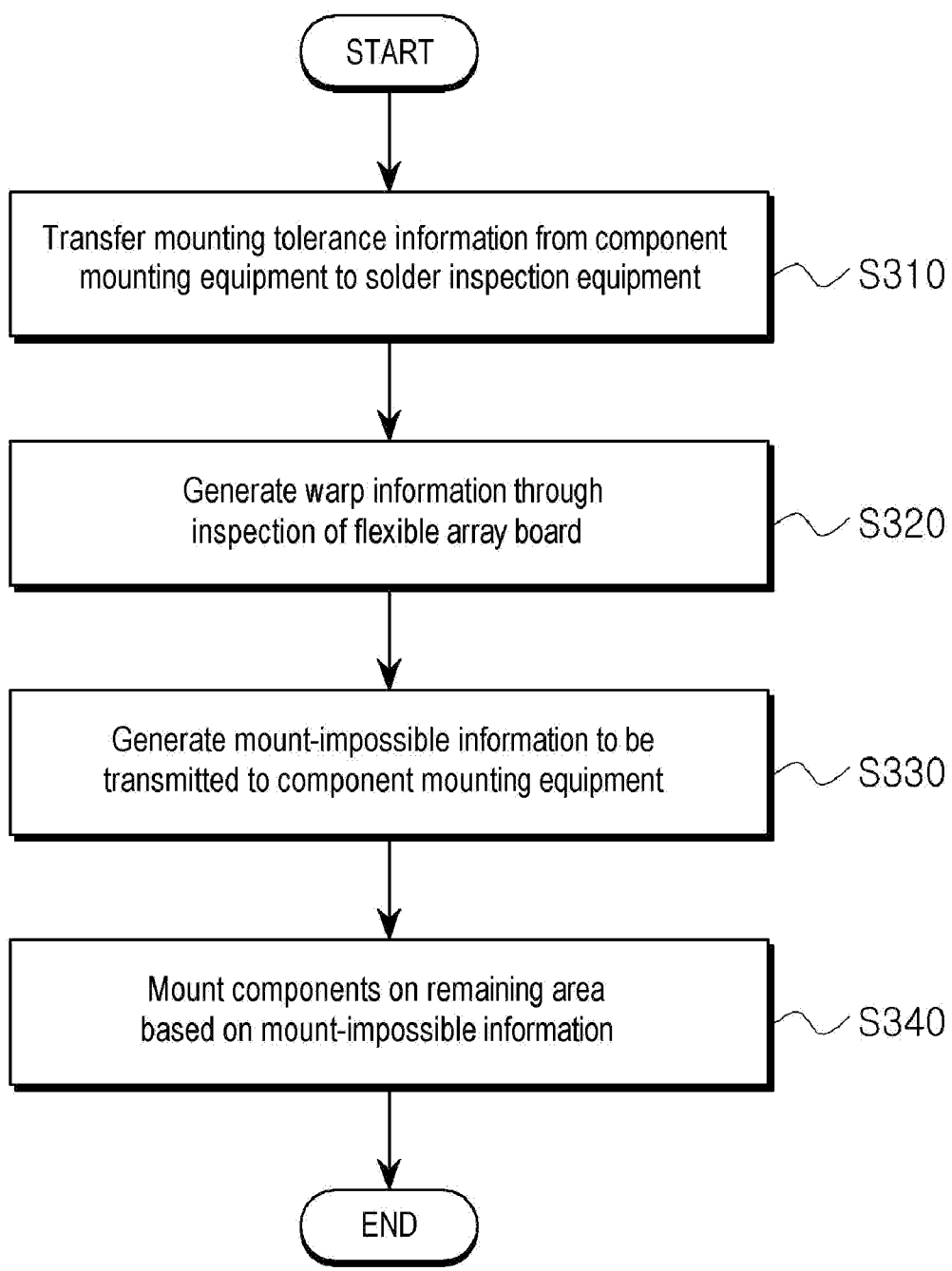

INSPECTION APPARATUS AND METHOD, AND SYSTEM AND METHOD FOR MOUNTING COMPONENTS INCLUDING THE SAME

TECHNICAL FIELD

The present invention relates to an inspection apparatus and method, and further relates to a component mounting system including the same and a method thereof. More specifically, the present invention relates to an inspection apparatus and a method for a process of mounting components on a flexible array board, and a component mounting system including the same and a method thereof.

BACKGROUND ART

In general, the process of mounting electronic components on a printed circuit board proceeds in the order of: applying solder onto the pad of the printed circuit board through screen printer equipment; inspecting the solder application state through solder paste inspection (SPI) equipment; and mounting the electronic components through component mounting equipment by using a surface mount technology (SMT).

In recent years, the use of a flexible printed circuit board having flexibility in electronic devices has been increasing. Typically, when mounting components on the flexible printed circuit board, a component mounting process is carried out while a plurality of flexible printed circuit boards is mounted on a jig in the form of an array.

However, in performing a component mounting process while a flexible printed circuit board is mounted on the jig, components may not be mounted in the correct positions of the flexible printed circuit board due to the characteristics of the flexible printed circuit board in which the flexible printed circuit board is thin and easily bent, thereby degrading the reliability of the component mounting process.

SUMMARY

Accordingly, in order to address the problem above, the present invention provides an inspection apparatus and method that can improve reliability of the component mounting process with respect to the flexible array board when mounting components on the flexible array board that is placed on a jig, and further provides a component mounting system including the same and a method thereof.

A component mounting system, according to an aspect of the present invention, may apply solder on a flexible array board that is placed on a jig through screen printer equipment; inspect a solder application state through solder paste inspection equipment; and mount components through component mounting equipment, wherein the solder paste inspection equipment is configured to receive mounting tolerance information from the component mounting equipment; generate warp information of the flexible array board through a measurement of the flexible array board; generate mount-impossible information on a region where mounting of components is impossible by comparing the mounting tolerance information with the warp information; and transmit the mount-impossible information to the component mounting equipment, and wherein the component mounting equipment is configured to mount components on remaining regions except for the region where mounting of components is impossible based on the mount-impossible information.

The mounting tolerance information may include maximum mounting angle information of the component mounting equipment.

The solder paste inspection equipment may generate the warp information on the amount of rotation of the flexible array board and on the bending of the flexible array board by measuring at least one of a fiducial position or a pad position of the flexible array board.

According to another aspect of the present invention, a method for mounting components in which solder is applied onto a flexible array board that is placed on a jig through screen printer equipment, a solder application state is inspected through solder paste inspection equipment, and then components are mounted through component mounting equipment may include transmitting mounting tolerance information from the component mounting equipment to the solder paste inspection equipment; generating, by the solder paste inspection equipment, warp information of the flexible array board through a measurement of the flexible array board; generating, by the solder paste inspection equipment, mount-impossible information on a region where mounting of components is impossible by comparing the mounting tolerance information with the warp information and transmitting the mount-impossible information to the component mounting equipment; and mounting, by the component mounting equipment, components on remaining regions except for the region where mounting of components is impossible based on the mount-impossible information.

An inspection apparatus, according to another aspect of the present invention, may include an information transmitting/receiving unit configured to receive mounting tolerance information from component mounting equipment and transmit information on whether mounting is possible to the component mounting equipment; a measuring unit configured to generate information on the amount of rotation of a flexible array board placed on a jig and on the bending of the flexible array board; and an analyzing unit configured to generate warp information by using information on the amount of rotation and on the bending and generate the information on whether mounting is possible on a region where mounting of components is impossible by comparing the mounting tolerance information with the warp information.

The measuring unit may be configured to inspect a solder application state on the flexible array board, measure whether or not the solder application is faulty, and transfer, to the analyzing unit, information on a region that is determined to be faulty, and the analyzing unit may be configured to add the information on the region that is determined to be faulty to the region where mounting of components is impossible.

The information on whether mounting is possible may include instruction information that instructs the component mounting equipment to exclude mounting of components on the region where mounting of components is impossible.

The mounting tolerance information may include maximum mounting angle information of the component mounting equipment.

The inspection apparatus may generate the warp information on the amount of rotation of the flexible array board and on the bending of the flexible array board by measuring at least one of a fiducial position, a pad position, or an outer line position of the flexible array board.

An inspection method, according to an embodiment of the present invention, may include receiving mounting tolerance information from component mounting equipment; generating warp information of a flexible array board that is placed on a jig; generating information on whether mounting is possible for a region where mounting of components is impossible by comparing the mounting tolerance information with the warp information; and transmitting the information on whether mounting is possible to the component mounting equipment.

The inspection method may further include inspecting a solder application state on the flexible array board, wherein generating the information on whether mounting is possible may include measuring whether the solder application is faulty and receiving information on a region that is determined to be faulty in inspecting the solder application state and adding the information on the region that is determined to be faulty to the region where mounting of components is impossible.

The mounting tolerance information may include maximum mounting angle information of the component mounting equipment.

Generating the warp information may include generating the warp information on the amount of rotation of the flexible array board and on the bending of the flexible array board by measuring at least one of a fiducial position, a pad position, or an outer line position of the flexible array board.

According to the inspection apparatus and method above, and according to the component mounting system and the method thereof, the mounting tolerance information of the component mounting equipment and the warp information of the flexible array board obtained through the inspection of the solder paste inspection equipment are comprehensively compared to set a mounting region for components, and the components are mounted only on the board or region where mounting of components is possible according thereto, thereby improving the efficiency and reliability of the component mounting process.

BRIEF DESCRIPTION OF THE DRAWINGS

FIG. 3 is a flowchart showing a component mounting method, according to an embodiment of the present invention.

DETAILED DESCRIPTION

Figure 1:
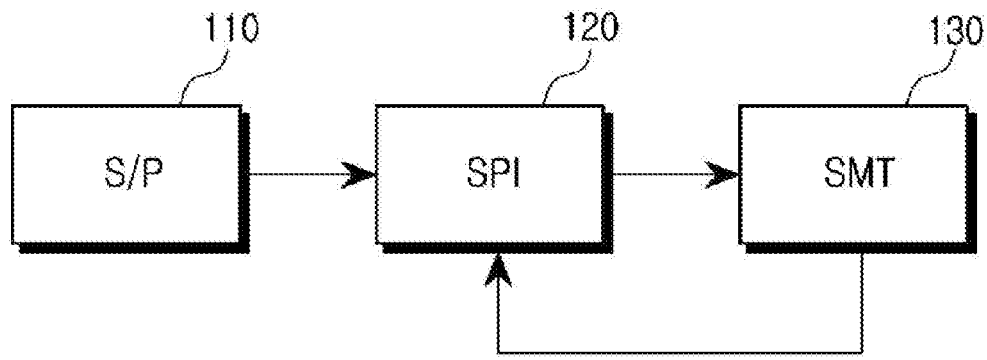
FIG. 1 is a block diagram showing a component mounting system, according to an embodiment of the present invention.

The present invention may be variously modified and may have a variety of forms, and thus, specific embodiments will be illustrated in the drawings and will be described in detail in the specification. However, it should be understood that this is not intended to limit the present invention to the disclosed specific forms and the embodiments encompass all of the changes, equivalents, and substitutes that belong within the spirit and technical scope of the present invention.

Terms, such as "first" or "second," may be used to explain a variety of elements, but the elements are not limited to the terms. The terms are used only for the purpose of distinguishing one element from the other element. For example, the first element may be referred to as the second element, and likewise, the second element may be referred to as the first element without departing from the scope of the present invention.

The terms that are used in the present specification are intended to merely explain specific embodiments, but are not intended to limit the present invention. Singular expressions may encompass plural expressions unless otherwise stated. Terms, such as "include" or "have," of the present specification are intended to represent that there are characteristics, numbers, steps, operations, elements, parts, or a combination thereof, which are described in the specification, and it should be understood that the terms do not exclude the possibility of the existence or addition of one or more other characteristics, numbers, steps, operations, elements, parts, or a combination thereof.

All the terms including technical terms and scientific terms that are used in the present specification have the same meanings that are commonly understood by those of ordinary skill in the art unless otherwise defined.

Any term that is defined in an ordinary dictionary shall be construed to have the same as the context of the related art, and shall not be construed as an ideal or excessively formal meaning unless specifically defined in the present specification.

A combination of each block of the accompanying block diagrams and each step of the accompanying flowchart may be performed by computer program instructions. The computer program instructions may be installed in processors of general purpose computers, special purpose computers, or other programmable data processing equipment, and the instructions that are executed by the processors of the computers or other programmable data processing equipment create means for performing functions that are described in each block of the block diagram or in each step of the flowchart. The computer program instructions may be stored in a computer-available or computer-readable memory that is able to support the computers or other programmable data processing equipment in order to realize the function in a specific manner. Therefore, the instructions stored in the computer-available or computer-readable memory may make manufactured articles that include instruction means for performing the function that is described in each block of the block diagrams or in each step of the flowchart. Since the computer program instructions can be installed in the computer or other programmable data processing equipment, the instructions that allow a series of operation steps to be performed in the computer or other programmable data processing equipment to create computer-executable processes to then operate the computer or the other programmable data processing equipment may provide steps for executing the functions that are described in each block of the block diagrams and in each step of the flowchart.

In addition, each block or each step may represent a portion of a module, a segment, or code that includes one or more executable instructions for performing a specified logical function. In addition, in some alternative embodiments, it should be noted that the functions that are described in the blocks or steps may occur out of the order. For example, two successive blocks or steps may be performed substantially at the same time, or, sometimes, may be performed in a reverse order depending upon the functions.

Hereinafter, preferred embodiments of the present invention will be described in detail with reference to the accompanying drawings.

FIG. 1 is a block diagram showing a component mounting system, according to an embodiment of the present invention.

Referring to FIG. 1, the component mounting system 100, according to an embodiment of the present invention, is configured for mounting components on a flexible array board which is placed on a jig, and includes screen printer equipment 110, solder paste inspection equipment 120, and component mounting equipment 130. The component mounting system 100 may apply solder onto the flexible array board placed on the jig through the screen printer equipment 110, inspect the solder application state through the solder paste inspection equipment 120, and then mount components through the component mounting equipment 130.

Since the flexible printed circuit board has characteristics of being easily bent or warped, mounting of components is performed in a state in which a plurality of boards is fixed to a jig in the form of an array for a component mounting process.

The screen printer equipment 110 is configured for applying solder on a pad of the flexible array board, and may apply the solder on the pad of the flexible array board while a stencil mask that has an opening formed to correspond to the position of the pad is disposed on the flexible array board.

The solder paste inspection equipment 120 inspects the solder application state through a measurement of the flexible array board which is transferred from the screen printer equipment 110. For example, the solder paste inspection equipment 120 obtains position information of the pad of the flexible array board and two-dimensional or three-dimensional shape information of the applied solder, and then inspects defects such as over-application, under-application, or inaccurate application of the solder by using the position and shape information.

After the inspection of the flexible array board through the solder paste inspection equipment 120, the component mounting equipment 130 mounts components on the flexible array board by referencing the inspection information of the solder paste inspection equipment 120. For example, when mounting the components on the flexible array board, the component mounting equipment 130 may align the components to the position of the pad by rotating a mounter head up to a predetermined angle to correspond to the rotational angle of the pad, and mount the components. However, since the rotational angle of the mounter head of the component mounting equipment 130 is determined to be within a predetermined range, it may be difficult to mount the components in a correct position when the flexible array board exceeds the maximum mounting angle of the component mounting equipment 130 due to a substantial warpage.

Accordingly, the present embodiment may improve the efficiency and reliability of a component mounting process with respect to the flexible array board through interworking between the solder paste inspection equipment 120 and the component mounting equipment 130.

Figure 2:
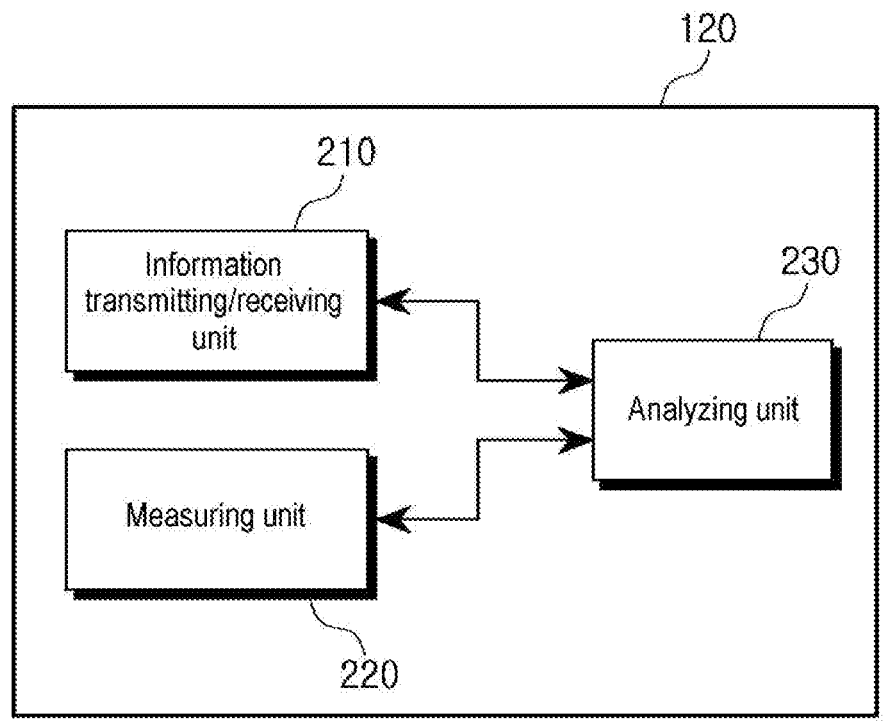
FIG. 2 is a block diagram showing a structure of solder paste inspection equipment, according to an embodiment of the present invention.

FIG. 2 is a block diagram showing a structure of the solder paste inspection equipment, according to an embodiment of the present invention.

Referring to FIG. 2, the solder paste inspection equipment 120 may include an information transmitting/receiving unit 210, a measuring unit 220, and an analyzing unit 230.

The information transmitting/receiving unit 210 may transmit and receive measurement and analysis information of the screen printer equipment 110 and the component mounting equipment 130 in a wired or wireless manner. In addition, the information transmitting/receiving unit 210 may also transmit the transmitted/received information to a predetermined computing device. For example, the information transmitting/receiving unit 210 may receive mounting tolerance information from the component mounting equipment 130, and thereafter, may transmit mount-impossible information to the component mounting equipment 130.

The measuring unit 220 may measure the solder application state of the flexible array board in a two-dimensional or three-dimensional manner to obtain shape information of the solder, and may generate measurement information on the amount of rotation of the flexible array board and on the bending of the flexible array board.

The analyzing unit 230 may derive an analyzed result based on the information measured by the measuring unit 220. The analyzing unit 230 may inspect defects, such as over-application, under-application, inaccurate application, the height, the warpage, etc. of the solder, through the shape information of the solder, and may set the region where the defects are detected as a first mount-impossible region based on the same.

In addition, the analyzing unit 230 may generate warp information by using the measurement information on the amount of rotation of the flexible array board and on the bending of the flexible array board, and may set a second mount-impossible region based on the warp information and the mounting tolerance information of the component mounting equipment 130. That is, the mount-impossible region information may contain at least one of the first and the second mount-impossible region information, and may be information for determining whether or not mounting is possible by the component mounting equipment 130 prior to the mounting in order to prevent components from being mounted on the faulty region.

Thereupon, the analyzing unit 230 may transmit the mount-impossible information to the information transmitting/receiving unit 210 for transmission to the component mounting equipment 130.

FIG. 3 is a flowchart showing a component mounting method, according to an embodiment of the present invention.

Referring to FIGS. 1 to 3, in order to improve the efficiency and reliability of a component mounting process, predetermined mounting tolerance information is first transmitted from the component mounting equipment 130 to the solder paste inspection equipment 120 (S310). Here, the mounting tolerance information may include maximum mounting angle information of the component mounting equipment 130. That is, the component mounting equipment 130 transmits, to the solder paste inspection equipment 120, information on maximum mounting angle, which represents the maximum angle to which the mounter head can rotate for mounting of components. Meanwhile, the mounting tolerance information may further include information such as a maximum mounting height of the mounter head, etc.

In addition, the mounting tolerance information may be transmitted from the component mounting equipment 130 to the solder paste inspection equipment 120 according to a specified criterion of the component mounting system 100 (for example, at predetermined times or only at the time of initial setting).

The solder paste inspection equipment 120 receives the mounting tolerance information from the component mounting equipment 130, and may separately generate warp information of the flexible array board through a measurement of the flexible array board that is placed on the jig (S320). For example, the solder paste inspection equipment 120 generates the warp information on the amount of rotation of the flexible array board and on the bending of the flexible array board by measuring at least one of a fiducial position, a pad position, or an outer line position of the flexible array board. At this time, two-dimensional information and three-dimensional information, which may include the bending and curves of the board determined by using height information, may be used as the information on the amount of rotation and bending.

The component mounting process is performed on a flexible array board while a plurality of flexible boards is placed on the jig in an array form. However, there is a high likelihood that the flexible array board may warp or bend during the process due to the characteristics of the flexible board. Accordingly, the solder paste inspection equipment 120 may generate warp information for each of the flexible array boards or warp information for each region thereof based on the fiducial information and the measurement information of the pads of the flexible array board.

Next, the solder paste inspection equipment 120 compares the mounting tolerance information transmitted from the component mounting equipment 130 with the warp information of the flexible array board generated by the solder paste inspection equipment 120 to generate mount-impossible information on a region where mounting of components is impossible, and transmits the mount-impossible information to the component mounting equipment 130 (S330). For example, if it is determined that the amount of rotation and the bending for each board or each region of the flexible array board exceeds the maximum mounting angle of the component mounting equipment 130 as a result of the measurement of the flexible array board, the solder paste inspection equipment 120 sets the corresponding board or region as a region where mounting of components is impossible and generates mount-impossible information (for example, pad information, coordinate information, or the like). The solder paste inspection equipment 120 transmits the generated mount-impossible information to the component mounting equipment 130.

The component mounting equipment 130 mounts components on the remaining regions except for the mount-impossible region based on the mount-impossible information transmitted from the solder paste inspection equipment 120 (S340). For example, the component mounting equipment 130 may not mount components on the boards that correspond to the mount-impossible information and may mount components on the remaining boards among the flexible array boards placed on the jig. Alternatively or additionally, the component mounting equipment 130 may not mount components on the region within a single board that corresponds to the mount-impossible information and may mount components on the remaining regions of the board.

Meanwhile, the mount-impossible information may include instruction information that instructs to exclude mounting of components on a corresponding board or a specific region in the corresponding board. Therefore, the component mounting equipment 130 that receives the corresponding instruction does not perform the mounting of components on the corresponding board or the specific region in the corresponding board.

As described above, the mounting tolerance information of the component mounting equipment 130 and the warp information of the flexible array board obtained through the inspection of the solder paste inspection equipment 120 may be comprehensively compared to set a mounting region for components, and the components may be mounted only on the board or region where mounting of components is possible according thereto, thereby improving the efficiency and reliability of the component mounting process.

Although the aforementioned detailed description of the present invention has been made with reference to the preferred embodiments of the present invention, those skilled in the art or having ordinary skill in the art will understand that the present invention may be changed and modified in various manners without departing from the spirit and technical scope of the present invention, which are shown in the claims below.

EXPLANATION OF REFERENCE NUMERALS

100: component mounting system 110: screen printer equipment
120: solder paste inspection equipment 130: component mounting equipment

What is claimed is:
1. A component mounting system comprising:
   screen printer equipment that applies solder on a flexible array board placed on a jig;
   solder paste inspection equipment that inspects a solder application state; and
   component mounting equipment that mounts components, wherein
   the solder paste inspection equipment is configured to:
      receive mounting tolerance information from the component mounting equipment;
      generate warp information of the flexible array board through a measurement of the flexible array board;
      compare the mounting tolerance information with the warp information to generate a comparison result;
      generate mount-impossible information on a region of the flexible array board where mounting of components is impossible based on the comparison result; and
      transmit the mount-impossible information to the component mounting equipment,
   the component mounting equipment is configured to mount components on remaining regions of the flexible array board except for the region where mounting of components is impossible based on the mount-impossible information, and
   the mounting tolerance information includes maximum mounting angle information of the component mounting equipment.
2. The component mounting system according to claim 1, wherein the solder paste inspection equipment generates the warp information on an amount of rotation of the flexible array board and on the bending of the flexible array board by measuring at least one of a fiducial position or a pad position of the flexible array board.

* * * * *